(12) United States Patent
Chen et al.

(10) Patent No.: US 9,451,701 B2
(45) Date of Patent: Sep. 20, 2016

(54) ELECTRONIC PACKAGE STRUCTURE

(71) Applicant: CYNTEC CO., LTD., Hsinchu (TW)

(72) Inventors: Da-Jung Chen, Taoyuan County (TW);
Chun-Tiao Liu, Hsinchu (TW);
Bau-Ru Lu, Changhua County (TW)

(73) Assignee: CYNTEC Co., Ltd., Hsinchu (TW)

(*) Notice: Subject to any disclaimer, the term of this patent is extended or adjusted under 35 U.S.C. 154(b) by 0 days.

(21) Appl. No.: 14/594,083

(22) Filed: Jan. 10, 2015

(65) Prior Publication Data
US 2015/0116973 A1 Apr. 30, 2015

Related U.S. Application Data

(60) Continuation of application No. 13/485,954, filed on Jun. 1, 2012, now Pat. No. 9,001,527, which is a continuation-in-part of application No. 12/971,671, filed on Dec. 17, 2010, now abandoned, which is a division of application No. 12/143,143, filed on Jun. 20, 2008, now abandoned.

(30) Foreign Application Priority Data

Feb. 18, 2008 (TW) .................................. 97105555 A

(51) Int. Cl.
*H05K 7/00* (2006.01)
*H05K 1/18* (2006.01)
(Continued)

(52) U.S. Cl.
CPC ............ *H05K 1/181* (2013.01); *H01F 27/022* (2013.01); *H01F 27/24* (2013.01); *H01F 27/29* (2013.01); *H01F 27/40* (2013.01); *H01L 23/645* (2013.01); *H01L 25/16* (2013.01); *H01F 27/027* (2013.01); *H01L 23/24* (2013.01); *H01L 23/3121* (2013.01); *H01L 23/552* (2013.01); *H01L 24/73* (2013.01); *H01L 2224/32225* (2013.01); *H01L 2224/48227* (2013.01); *H01L 2224/73265* (2013.01); *H01L 2924/1305* (2013.01); *H01L 2924/13055* (2013.01); *H01L 2924/13091* (2013.01); *H01L 2924/181* (2013.01); *H01L 2924/3025* (2013.01);
(Continued)

(58) Field of Classification Search
CPC ............ H05K 1/18; H05K 5/00; H05K 7/00; H05K 1/02; H05K 3/34; H01L 27/12; H01L 27/22; H01L 23/48; H01L 23/52; H01L 23/58; H01F 7/00; H01F 7/08; H01F 27/02; H01F 27/28; H01F 27/29; H01F 38/00
USPC ................ 361/882, 752, 813, 729; 174/536; 257/666, 676, 679, 784; 336/65; 363/141
See application file for complete search history.

(56) References Cited

U.S. PATENT DOCUMENTS 4,012,723 A * 3/1977 Harper .............................. 365/2
4,096,581 A * 6/1978 Carlo et al. ...................... 365/2
(Continued)

*Primary Examiner* — Xiaoliang Chen
(74) *Attorney, Agent, or Firm* — Min-Lee Teng; Litron Patent and Trademark Office

(57) ABSTRACT

The present invention discloses an electronic package structure. The body has a top surface with a cavity thereon, the first conductive element is disposed in the cavity, and the second conductive element is disposed in the body. The first external electrode electrically connected to the first conductive element and the second external electrode electrically connected to the second conductive element are both disposed on the top surface of the body or a first surface formed by the top surface of the encapsulation compound and the exposed portions of the top surface of the body which are not covered by the encapsulation compound.

20 Claims, 7 Drawing Sheets

(51) Int. Cl.
  *H01L 23/64* (2006.01)
  *H01L 25/16* (2006.01)
  *H01F 27/24* (2006.01)
  *H01F 27/29* (2006.01)
  *H01F 27/40* (2006.01)
  *H01F 27/02* (2006.01)
  *H05K 3/34* (2006.01)
  *H01L 23/24* (2006.01)
  *H01L 23/31* (2006.01)
  *H01L 23/552* (2006.01)
  *H01L 23/00* (2006.01)

(52) U.S. Cl.
  CPC ... *H01L 2924/30107* (2013.01); *H05K 3/3421* (2013.01); *H05K 2201/1003* (2013.01); *H05K 2201/10515* (2013.01); *H05K 2201/10537* (2013.01); *H05K 2201/10924* (2013.01); *Y02P 70/611* (2015.11); *Y10T 29/49146* (2015.01)

(56) References Cited

U.S. PATENT DOCUMENTS

| | | | | |
|---|---|---|---|---|
| 4,845,452 A * | 7/1989 | Sasaki et al. | | 336/200 |
| 6,111,478 A * | 8/2000 | Furutani et al. | | 333/174 |
| 6,198,375 B1 * | 3/2001 | Shafer | | 336/225 |
| 6,218,925 B1 * | 4/2001 | Iwao | | 336/200 |
| 6,238,779 B1 * | 5/2001 | Iwao et al. | | 428/210 |
| 6,593,841 B1 * | 7/2003 | Mizoguchi et al. | | 336/200 |
| 7,612,641 B2 * | 11/2009 | Jean et al. | | 336/192 |
| 7,675,396 B2 * | 3/2010 | Liu et al. | | 336/200 |
| 2002/0034026 A1 * | 3/2002 | Orcutt et al. | | 359/877 |
| 2002/0074145 A1 * | 6/2002 | Fischer | | H01L 23/495 |
| | | | | 174/536 |
| 2002/0105052 A1 * | 8/2002 | Tokuda et al. | | 257/531 |
| 2003/0076211 A1 * | 4/2003 | Matsuta et al. | | 336/200 |
| 2005/0270745 A1 * | 12/2005 | Chen et al. | | 361/707 |
| 2006/0022788 A1 * | 2/2006 | Sasamori et al. | | 336/208 |
| 2006/0023389 A1 * | 2/2006 | Ito | | 361/143 |
| 2006/0071749 A1 * | 4/2006 | Aoki et al. | | 336/83 |
| 2006/0114094 A1 * | 6/2006 | Jean et al. | | 336/182 |
| 2006/0119461 A1 * | 6/2006 | Kawarai | | 336/200 |
| 2007/0247268 A1 * | 10/2007 | Oya et al. | | 336/200 |
| 2007/0252706 A1 * | 11/2007 | Furutani | | 340/572.8 |
| 2008/0023810 A1 * | 1/2008 | Yamazaki et al. | | 257/679 |
| 2008/0029907 A1 * | 2/2008 | Koduri | | 257/784 |
| 2008/0036566 A1 * | 2/2008 | Klesyk et al. | | 336/84 M |
| 2008/0107873 A1 * | 5/2008 | Kuwajima et al. | | 428/195.1 |
| 2008/0303125 A1 * | 12/2008 | Chen et al. | | 257/676 |
| 2009/0057822 A1 * | 3/2009 | Wen et al. | | 257/531 |
| 2009/0207574 A1 * | 8/2009 | Chen et al. | | 361/761 |
| 2009/0310278 A1 * | 12/2009 | Tani | | 361/306.3 |
| 2011/0169596 A1 * | 7/2011 | Ahrens et al. | | 336/200 |
| 2012/0014079 A1 * | 1/2012 | Chen et al. | | 361/782 |
| 2012/0086102 A1 * | 4/2012 | Hofmann et al. | | 257/531 |
| 2012/0236519 A1 * | 9/2012 | Chen et al. | | 361/752 |
| 2012/0262145 A1 * | 10/2012 | Chen et al. | | 323/311 |
| 2013/0175877 A1 * | 7/2013 | Abe et al. | | 307/104 |
| 2013/0307655 A1 * | 11/2013 | Saito et al. | | 336/83 |
| 2014/0022041 A1 * | 1/2014 | Park et al. | | 336/199 |
| 2014/0043196 A1 * | 2/2014 | Gouchi et al. | | 343/788 |
| 2014/0062437 A1 * | 3/2014 | Malcolm et al. | | 323/282 |
| 2014/0104133 A1 * | 4/2014 | Finn et al. | | 343/866 |
| 2014/0176286 A1 * | 6/2014 | Okada et al. | | 336/200 |
| 2015/0022193 A1 * | 1/2015 | Burdette et al. | | 324/239 |
| 2015/0022198 A1 * | 1/2015 | David et al. | | 324/251 |

* cited by examiner

ELECTRONIC PACKAGE STRUCTURE

CROSS-REFERENCE TO RELATED APPLICATION

This application is a continuation of U.S. patent application Ser. No. 13/485,954 filed on Jun. 1, 2012, which is a continuation-in-part of U.S. patent application Ser. No. 12/971,671 filed on Dec. 17, 2010, now U.S. Pub. No. 2011/0090648, which is a divisional of U.S. patent application Ser. No. 12/143,143 filed on Jun. 20, 2008, now U.S. Pub. No. 2009/0207574, now abandoned, which claims priority of Taiwan application Ser. No. 97105555 filed on Feb. 18, 2008. The entirety of the above-mentioned patent applications are hereby incorporated by reference herein and made a part of specification.

BACKGROUND OF THE INVENTION

1. Field of the Invention

The present invention relates to a package structure. More particularly, the present invention relates to an electronic package structure.

2. Description of Related Art

Electronic package structures are formed by complicated package processes. Different electronic package structures have different electrical performances and capacities of heat dissipation, and therefore a designer may select an electronic package structure with a desired electrical performance and capacity of heat dissipation according to a design requirement.

FIG. 1 is a schematic diagram of a conventional electronic package structure. Referring to FIG. 1, the conventional electronic package structure 100 includes a printed circuit board (PCB) 110 and a plurality of electronic elements 120. The electronic elements 120 are disposed on a surface 112 of the PCB 110 and electrically connected to the PCB 110. The PCB 110 has a plurality of pins 116 extending out from another surface 114 of the PCB 110 to be electrically connected to an electronic device, for example, a motherboard (not shown).

FIG. 2 is a schematic diagram of another conventional electronic package structure. Referring to FIG. 2, the conventional electronic package structure 200 includes a circuit substrate 210 and a plurality of electronic elements 220. The electronic elements 220 are disposed on a surface 212 of the circuit substrate 210, and electrically connected to the circuit substrate 210 via a wire bonding technology, a flip-chip bonding technology or a surface mount technology. Moreover, the conventional electronic package structure 200 may be electrically connected to an electronic device, for example, a motherboard (not shown), via a solder paste or a plurality of solder balls (not shown).

It should be noted that the electronic elements 120 of the conventional electronic package structure 100 are all disposed on the surface 112 of the PCB 110, and the electronic elements 220 of the conventional electronic package structure 200 are all disposed on the surface 212 of the circuit substrate 210. Therefore, in the conventional electronic package structures 100 and 200, spatial utilization of the PCB 110 and the circuit substrate 210 is relatively low, and sizes of the conventional electronic package structures 100 and 200 are relatively great.

SUMMARY OF THE INVENTION

In accordance with the present invention, an electronic package structure can achieve a relatively high utilization of an internal space thereof, so that a size of the electronic package structure can be reduced.

In one embodiment of the present invention, an electronic package structure is provided. The body has a top surface with a cavity thereon, a first conductive element is disposed in the cavity, and a second conductive element is disposed in the body. A first external electrode electrically connected to the first conductive element and the second external electrode electrically connected to the second conductive element are both disposed on the top surface of the body or a first surface formed by the top surface of the encapsulation compound and the exposed portions of the top surface of the body which are not covered by the encapsulation compound. Because the first conductive element is disposed in the cavity of the body in the electronic package structure, space in the electronic package structure can be used more efficiently compared with the conventional electronic package structures, In order to make the aforementioned and other objects, features and advantages of the present invention comprehensible, a preferred embodiment accompanied with figures is described in detail below.

DESCRIPTION OF EMBODIMENTS

First Embodiment

Figure 3A:
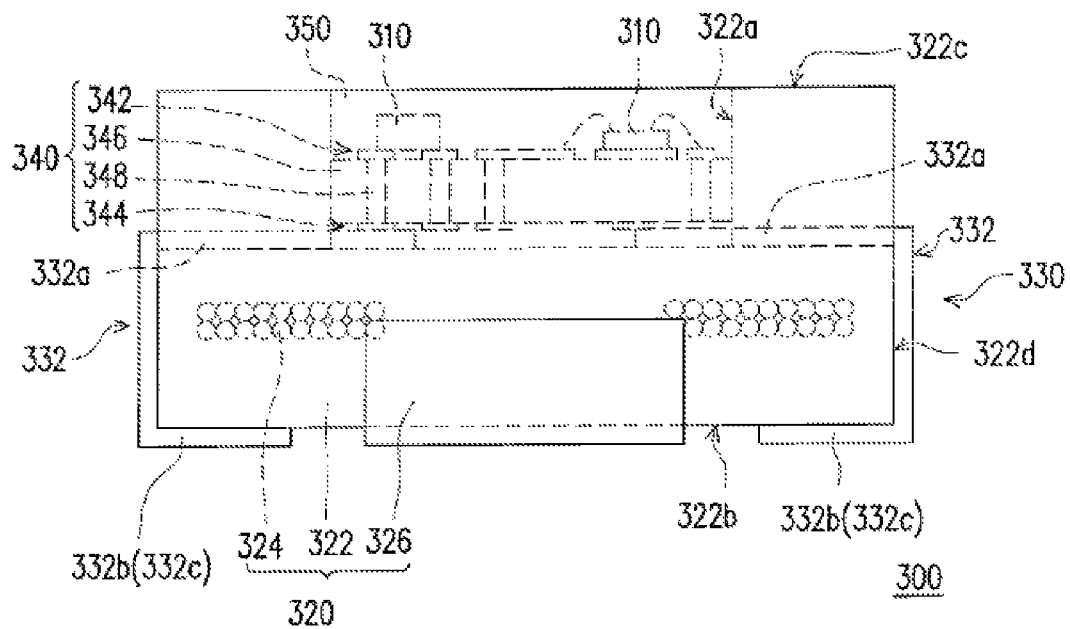
FIG. 3A is a schematic diagram of an electronic package structure according to a first embodiment of the present invention.

FIG. 3A is a schematic diagram of an electronic package structure according to a first embodiment of the present invention. Referring to FIG. 3A, the electronic package structure 300 includes at least one first electronic element 310 (two first electronic elements are illustrated in FIG. 3A), a second electronic element 320 and a first lead frame 330. The electronic package structure 300 is generally applied to a voltage regulator module, a network adapter, a graphics processing unit, a DC/DC converter or a point-of-load (POL) converter. Each of the first electronic elements 310 can be a logical control element, a driving element or a passive element. The passive element can be a capacitor, an inductor with lesser inductance, or a resistor. Each of the first electronic elements 310 can also be a power element, such as a metal-oxide-semiconductor field effect transistor (MOSFET), an insulated gate bipolar transistor (IGBT) or a diode.

The second electronic element 320 includes a body 322 having a cavity 322a. The first electronic elements 310 are disposed in the cavity 322a. In the embodiment, the body 322 of the second electronic element 320 has a first surface 322b, a second surface 322c opposite to the first surface 322b and a side surface 322d. The cavity 322a sinks in a direction from the second surface 322c towards the first surface 322b. The side surface 322d connects the first surface 322b and the second surface 322c. Besides, the second electronic element 320 can be an energy-storage element used for storing electric energy. In detail, the second electronic element 320 further includes a coil 324 and a plurality of first external electrodes 326. The coil 324 is disposed within the body 322. The first external electrodes 326 are respectively connected to two opposite ends of the coil 324, and extend outside the body 322 to locate on the first surface 322b and the side surface 322d. The body 322 comprising a magnetic body encloses the coil 324. The second electronic element 320 can be an inductive element with a greater inductance and a greater size than the first electronic elements 310.

The first lead frame 330 has a plurality of leads 332. Each of the leads 332 has a first end 332a and a second end 332b, and the first end 332a of each of the leads 332 can be embedded in the body 322 and extends to the cavity 322a for electrically connecting to the first electronic elements 310. The second end 332b of each of the leads 332 is disposed on the first surface 322b of the body 322 to form a second external electrode 332c, and a part of each of the leads 332 connecting the first end 332a and the second end 332b is disposed on the side surface 322d of the body 322.

In the present embodiment, the electronic package structure 300 further includes a circuit substrate 340 and an insulating encapsulant 350. The circuit substrate 340 is disposed in the cavity 322a of the body 322. The first electronic elements 310 can be disposed on the circuit substrate 340 and electrically connected to the circuit substrate 340. The circuit substrate 340 is electrically connected to the first end 332a of each of the leads 332 extending to the cavity 322a. The first electronic elements 310 may be electrically connected to the circuit substrate 340 via a wire bonding technology, a flip-chip bonding technology or a surface mount technology. The circuit substrate 340 has a first circuit layer 342, a second circuit layer 344, a dielectric layer 346 disposed between the first circuit layer 342 and the second circuit layer 344, and at least a conductive channel 348. The first electronic elements 310 are disposed on the first circuit layer 342, and the conductive channel 348 penetrates the dielectric layer 346 for electrically connecting the first circuit layer 342 and the second circuit layer 344. It should be noted that the circuit board 340 of the electronic package structure 300 may be omitted according to a design requirement of a designer, though it is not illustrated.

Moreover, the insulating encapsulant 350 is disposed in the cavity 322a and encapsulates the first electronic elements 310 and the circuit substrate 340 for protecting the first electronic elements 310 and the circuit substrate 340, and enhancing a whole mechanical strength of the electronic package structure 300.

Figure 1:
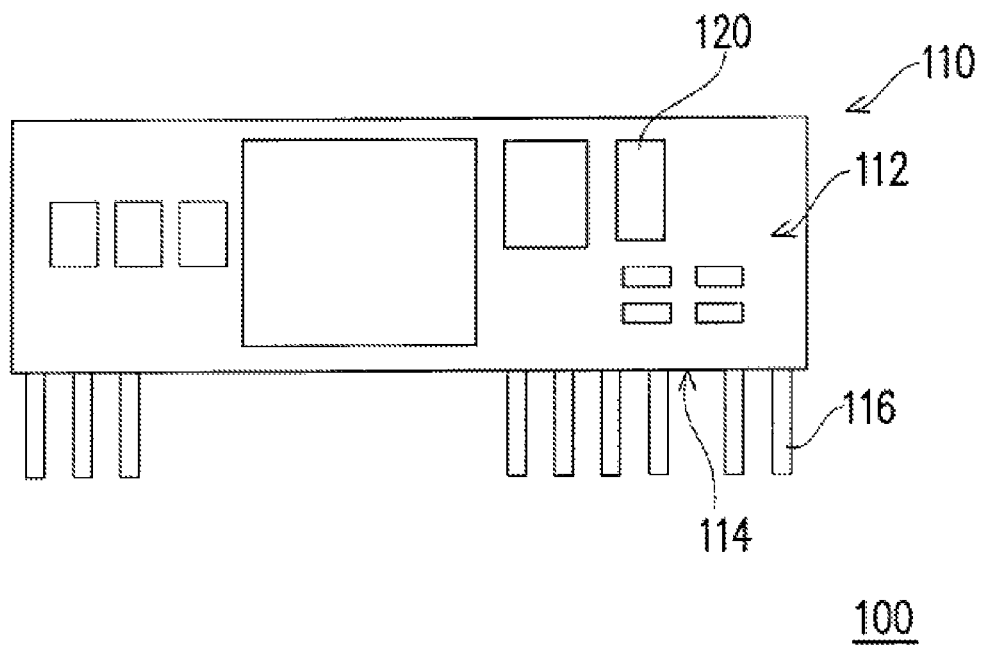
FIG. 1 is a schematic diagram of a conventional electronic package structure.
Figure 2:
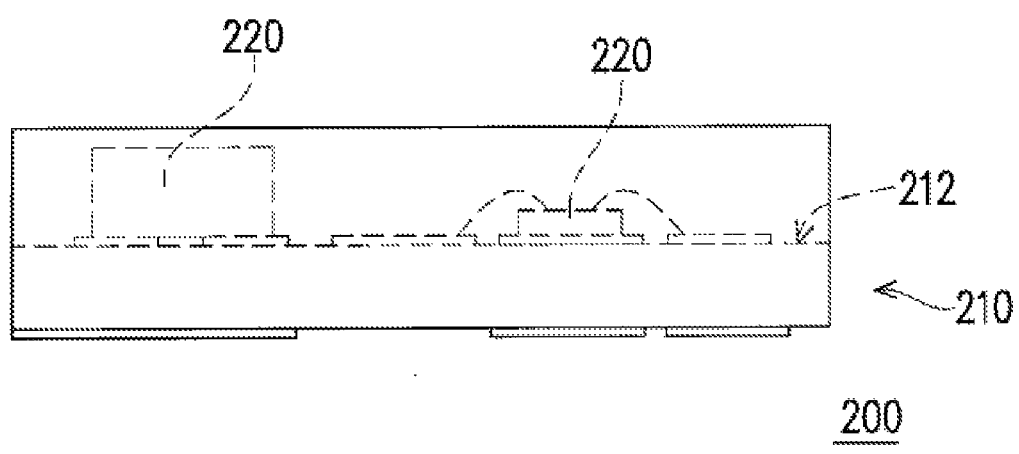
FIG. 2 is a schematic diagram of another conventional electronic package structure.

Since the first electronic elements 310 and the circuit substrate 340 are disposed in the cavity 322a of the second electronic element 320, compared to a conventional electronic package structures of FIG. 1 and FIG. 2, utilization of an internal space of the electronic package structure 300 is relatively high, and the first electronic elements 310 and the circuit substrate 340 can be protected by the cavity 322a. Besides, since the insulating encapsulant 350 is disposed in the cavity 322a, material of the insulating encapsulant 350 can be directly filled into the cavity 322a without aiding of extra mold during formation of the insulating encapsulant 350.

Figure 3B:
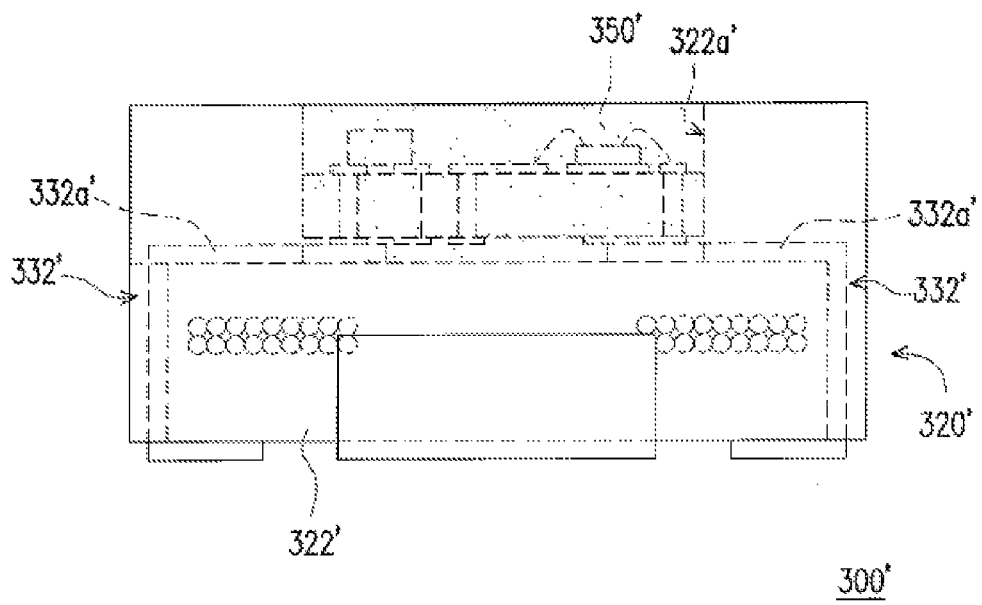
FIG. 3B is a schematic diagram of another electronic package structure according to the first embodiment of the present invention.

FIG. 3B is a schematic diagram of another electronic package structure according to the first embodiment of the present invention. Referring to FIG. 3A and FIG. 3B, a difference between the electronic package structure 300' and the electronic package structure 300 is that a part of each lead 332' connecting a first end 332a' and a second end 332b' penetrates a body 322'. Besides, the insulating encapsulant 350 of the electronic package structure 300 is different from a magnetic encapsulant 350' of the electronic package structure 300'. The magnetic encapsulant 350' is disposed in a cavity 322a' of the body 322'. Therefore, if a second electronic element 320' is an inductive element, an inductive characteristic of the second electronic element 320' influenced by the cavity 322' then can be compensated by the magnetic encapsulant 350'. It should be noted that a part of each of the leads 332 connecting the first end 332a and the second end 332b may also penetrate the body 322 according to a design requirement, though it is not illustrated.

Figure 3C:
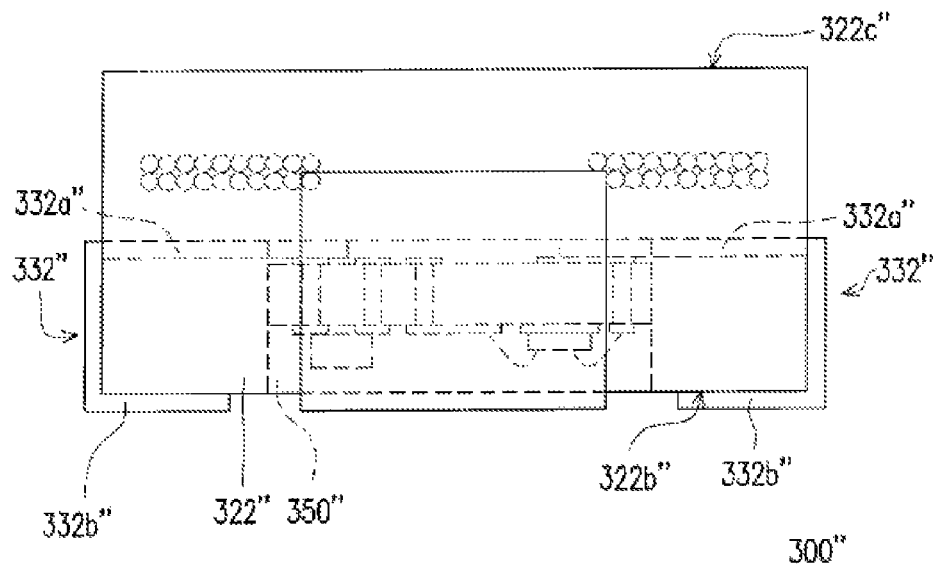
FIG. 3C is a schematic diagram of another electronic package structure according to the first embodiment of the present invention.

FIG. 3C is a schematic diagram of another electronic package structure according to the first embodiment of the present invention. Referring to FIG. 3A and FIG. 3C, a difference between the electronic package structure 300" and the electronic package structure 300 is that a cavity 322a" of a body 322" sinks in a direction from a first surface 322b" towards a second surface 322c". It should be noted that an insulating encapsulant 350" can be substituted by a magnetic encapsulant according to a design requirement, and a part of each lead 332" connecting a first end 332a" and a second end 332b" may also penetrate the body 322" according to a design requirement, though it is not illustrated.

Figure 3D:
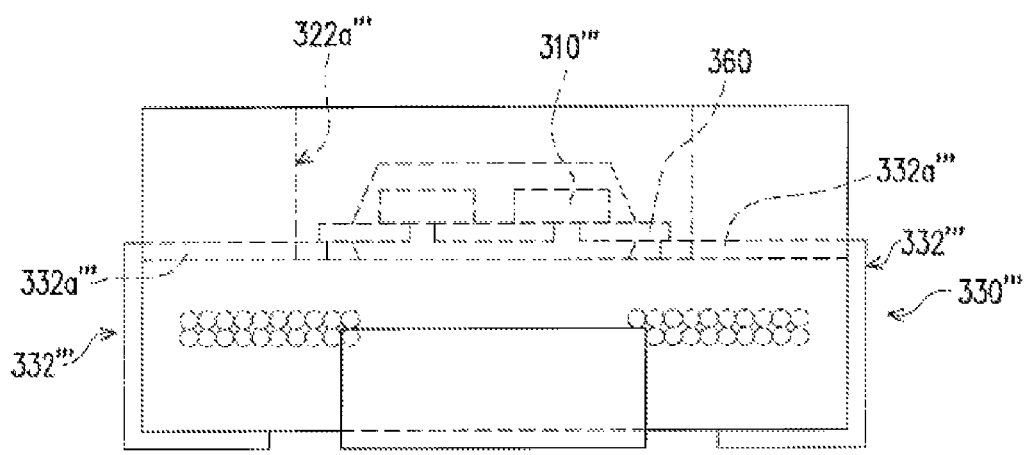
FIG. 3D is a schematic diagram of still another electronic package structure according to the first embodiment of the present invention.

FIG. 3D is a schematic diagram of still another electronic package structure according to the first embodiment of the present invention. Referring to FIG. 3A and FIG. 3D, a second lead frame 360 is applied in the electronic package structure 300' for substituting the circuit substrate 340 of the electronic package structure 300 according to a design requirement. A plurality of first electronic elements 310' are disposed on the second lead frame 360 and electrically connected to the second lead frame 360. The second lead frame 360 is electrically connected to a first end 332a" of each lead 332' of a first lead frame 330' that extends to a cavity 322a".

Second Embodiment

Figure 4A:
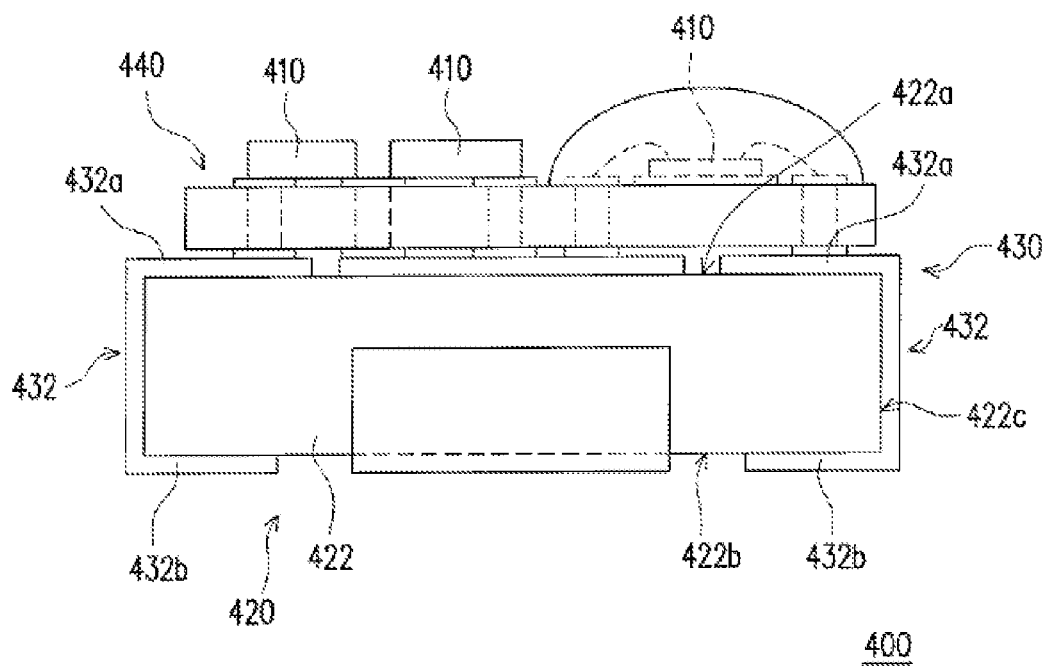
FIG. 4A is a schematic diagram of an electronic package structure according to a second embodiment of the present invention.

FIG. 4A is a schematic diagram of an electronic package structure according to a second embodiment of the present invention. Referring to FIG. 4A and FIG. 3A, a difference between the electronic package structure 400 of the second embodiment and the electronic package structure 300 of the first embodiment is that a body 422 of a second electronic element 420 does not have the cavity 322a. In detail, a first end 432a of each lead 432 of a lead frame 430 is disposed on a first surface 422a of a body 422, and a plurality of first electronic elements 410 are disposed on the first surface 422a and electrically connected to the leads 432. Moreover, a second end 432b of each of the leads 432 is disposed on a second surface 422b of the body 422 opposite to the first surface 422a, and a part of each of the leads 432 connecting the first end 432a and the second end 432b is disposed on a side surface 422c of the body 422.

Furthermore, a circuit substrate 440 is disposed on the first surface 422a and electrically connected to the leads 432, and the first electronic elements 410 are disposed on the circuit substrate 440 and electrically connected to the circuit substrate 440. It should be noted that the circuit substrate 440 of the electronic package structure 400 may be omitted according to a design requirement of the designer, or the circuit substrate 440 may be substituted by a lead frame, though it is not illustrated.

Figure 4B:
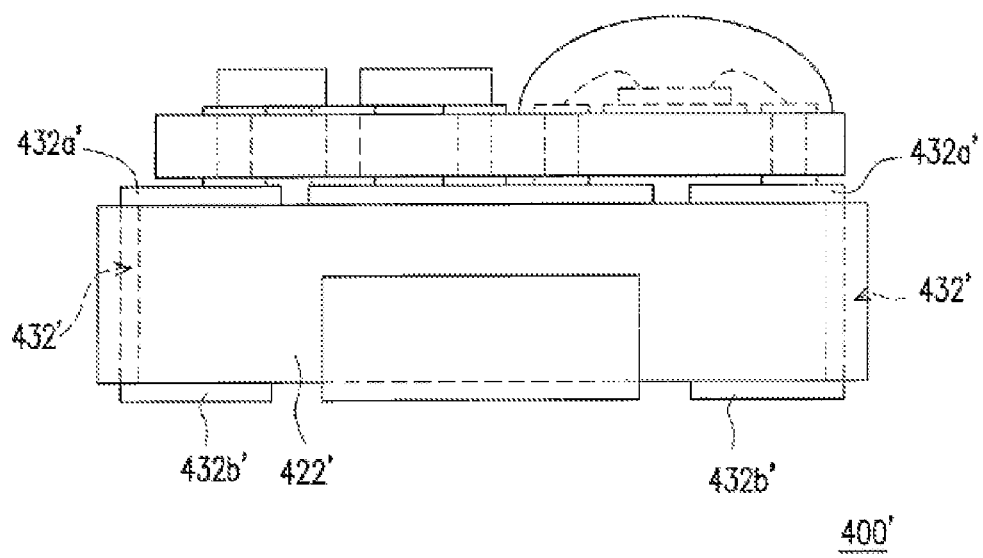
FIG. 4B is a schematic diagram of another electronic package structure according to the second embodiment of the present invention.

FIG. 4B is a schematic diagram of another electronic package structure according to the second embodiment of the present invention. Referring to FIG. 4A and FIG. 4B, a difference between the electronic package structure 400' and the electronic package structure 400 is that a part of each lead 432' connecting a first end 432a' and a second end 432b' penetrates a body 422'.

Third Embodiment

Figure 5A:
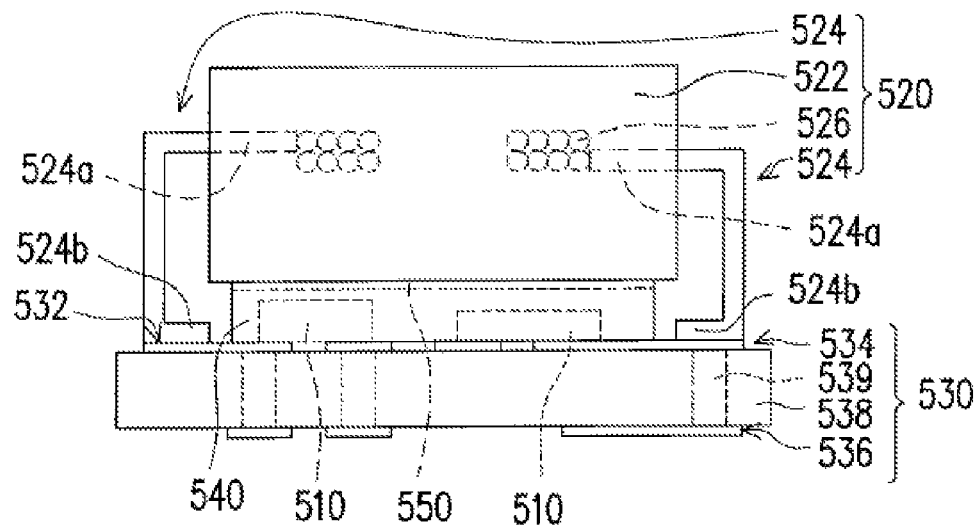
FIG. 5A is a schematic diagram of an electronic package structure according to a third embodiment of the present invention.

FIG. 5A is a schematic diagram of an electronic package structure according to a third embodiment of the present invention. Referring to FIG. 5A, in the electronic package structure 500 of the present embodiment, a plurality of first electronic elements 510 are disposed on a first surface 532 of a circuit substrate 530 and electrically connected to the circuit substrate 530. A second electronic element 520 is disposed above the first surface 532 of the circuit substrate 530. The first electronic elements 510 are located between a body 522 of the second electronic element 520 and the first surface 532 of the circuit substrate 530, and the first electronic elements 510 are located between leads 524 of the second electronic element 520. In other words, in the present embodiment, the second electronic element 520 covers the first electronic elements 510. Besides, an insulating encapsulant 540 is disposed between the second electronic element 520 and the circuit substrate 530 and encapsulating the first electronic elements 510 for protecting the first electronic elements 510 and enhancing a whole mechanical strength of the electronic package structure 500. Moreover, the circuit substrate 530 may further include at least a conductive channel 539, and each of the conductive channels 539 penetrates a dielectric layer 538 for electrically connecting a first circuit layer 534 and a second circuit layer 536. At least one of the conductive channels 539 (for example, the two conductive channels 539 located at a left side of FIG. 5A) is located below at least one of the first electronic elements 510 (for example, the first electronic element 510 located at the left side of FIG. 5A), so that heat generated by the first electronic element 510 located at the left side may be quickly transmitted to where is outside the electronic package structure 500 via the two conductive channels 539 located at the left side. A second end 524b of each of the leads 524 of the second electronic element 520 extends out from the body 522 to electrically connect the circuit substrate 530. The second electronic element 520 may be an inductive element including a coil 526. The body 522 which is a magnetic wrap wraps the coil 526, and a first end 524a of each of the leads 524 is connected to one of two opposite ends of the coil 526.

It should be noted that the electronic package structure 500 further includes an electromagnetic-interference-shielding element (EMI-shielding element) 550 covering the first electronic elements 510. In the present embodiment, the EMI-shielding element 550 is disposed on the body 522 of the second electronic element 520, and is located between the body 522 of the second electronic element 520 and the circuit substrate 530. Therefore, during operation of the electronic package structure 500, it may be reduced by means of the EMI-shielding element 550 that electrical signals transmitted in the circuit substrate 530 is interfered by a magnetic force generated by the second electronic element 520 which functions as an inductive element.

Figure 5B:
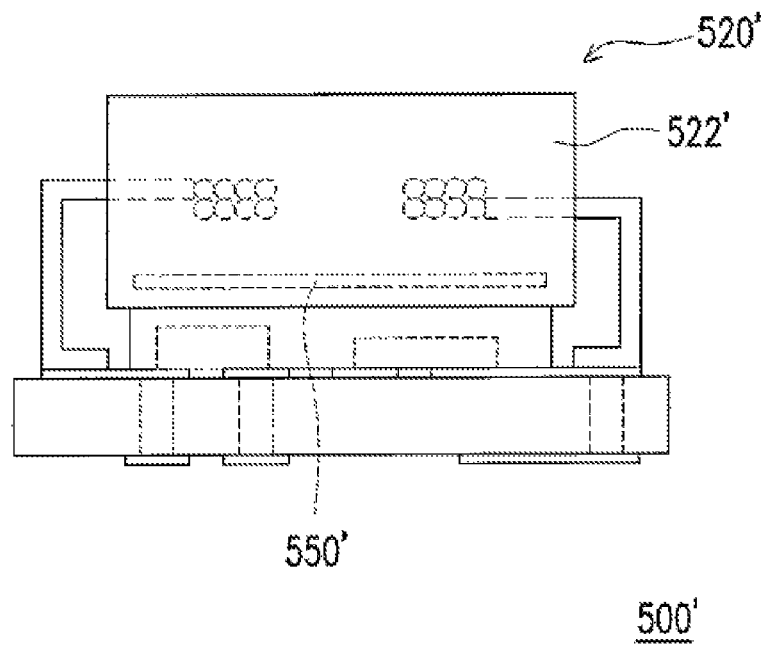
FIG. 5B is a schematic diagram of another electronic package structure according to the third embodiment of the present invention.

FIG. 5B is a schematic diagram of another electronic package structure according to the third embodiment of the present invention. Referring to FIG. 5A and FIG. 5B, a difference between the electronic package structure 500' and the electronic package structure 500 is that an EMI-shielding element 550' of the electronic package structure 500' is disposed in a cavity 522' of a second electronic element 520'.

Fourth Embodiment

Fourth embodiment discloses an electronic package structure in which a first external electrode and a second external electrode are disposed on the top surface of the body in the electronic package structure (See FIG. 6A to 6D. It can be also seen in reversed FIG. 3C). In one embodiment, an encapsulation compound has a top surface disposed in the cavity to encapsulate the first conductive element, wherein the top surface of the encapsulation compound and the exposed portions of the top surface of the body which are not covered by the encapsulation compound form a first surface, and the first external electrode and the second external electrode are disposed on the first surface. The first external electrode and the second external electrode can be patterned on the top surface of the body by known methods, such as lithography process or printing process.

Figure 6A:
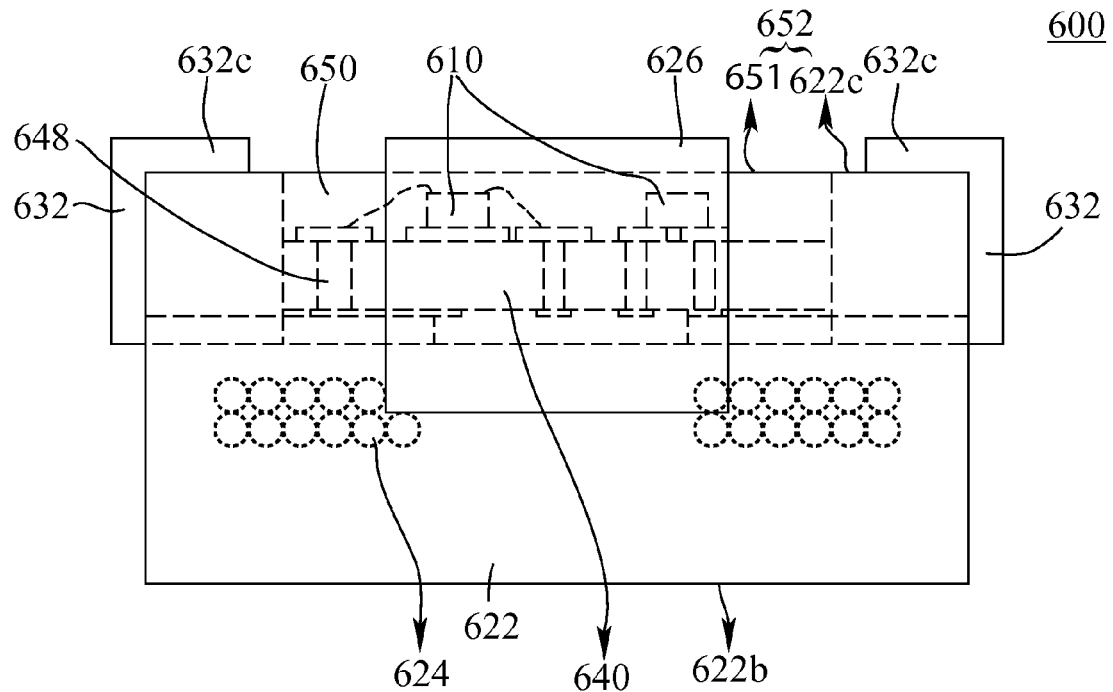
FIG. 6A to FIG. 6D illustrate a schematic cross-sectional view of an electronic package structure in which a first external electrode and a second external electrode are disposed on the top surface of the body in the electronic package structure.

FIG. 6A illustrates a schematic cross-sectional view of example 1. Structure in Example 1 mainly comprises a first conductive element 610, a first external electrode 632c, a body 622, a second conductive element 624 and a second external electrode 626. The first external electrode 632c and the second external electrode 626 are disposed on the top surface 622c of the body 622 in the electronic package structure 600. The body 622 comprises a cavity 622a on the top surface 622c of the body 622, and the first conductive element 610 is disposed in the cavity 622a. The second conductive element 624, such as a coil, a choke or an inductor, is disposed within the body 622. In one embodiment, the second conductive element 624 can be enclosed by the body 622. The body 622 can be made of a magnetic material. The body 622 can comprise a magnetic wrap wrapping the second conductive element 624.

In one embodiment, an encapsulation compound 650 has a top surface disposed in the cavity 622a to encapsulate the first conductive element 610, wherein the top surface 651 of the encapsulation compound 650 and the exposed portions 622c of the top surface of the body 622 which are not covered by the encapsulation compound 650 form a first surface 652, and the first external electrode 632c and the second external electrode 626 are disposed on the first surface 652.

The first conductive element 610 is electrically connected to the first external electrode 632c via the electrical path encompassing the conductive channel 648 in the circuit substrate 640 and the lead 632, wherein one portion of the lead 632 horizontally penetrates the body 622 and another portion of the lead 632 is disposed on the top surface 622c and the lateral surface 622d of the body 622. The second conductive element 624 is electrically connected to the second external electrode 626 via the electrical path outside the body 622 (e.g., a lead). In one embodiment, the second conductive element 624 can be electrically connected to the second external electrode 626 via the electrical path inside the body 622 (similar to vertical penetration in the body in FIG. 3B).

Figure 6B:
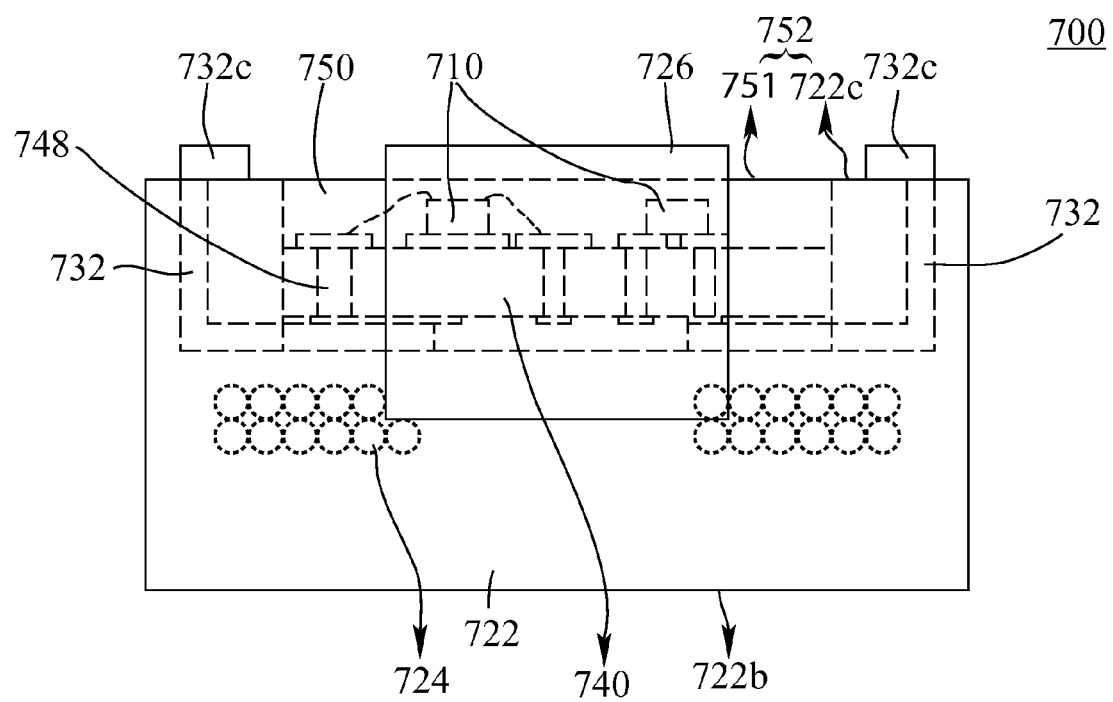

FIG. 6B illustrates a schematic cross-sectional view of example 2. In one embodiment, the first conductive element 710 is electrically connected to the first external electrode 732c via the electrical path inside the body 722. Compared with FIG. 6A, the difference between the electronic package structure 600 and the electronic package structure 700 is that a portion of the lead 732 vertically penetrates the body 722. The technology of the lead 732 penetrating the body 722 can be performed by known techniques, such as mechanical drilling or laser through-hole, and it can be also applied to the body 722 which is made by LTCC (low-temperature co-fired ceramics) in particular.

In one embodiment, (refer to FIG. 6A and FIG. 6B again) the first conductive element is electrically connected to the first external electrode via the electrical path inside the body, and the second conductive element is electrically connected to the second external electrode via the electrical path inside the body.

Figure 6C:
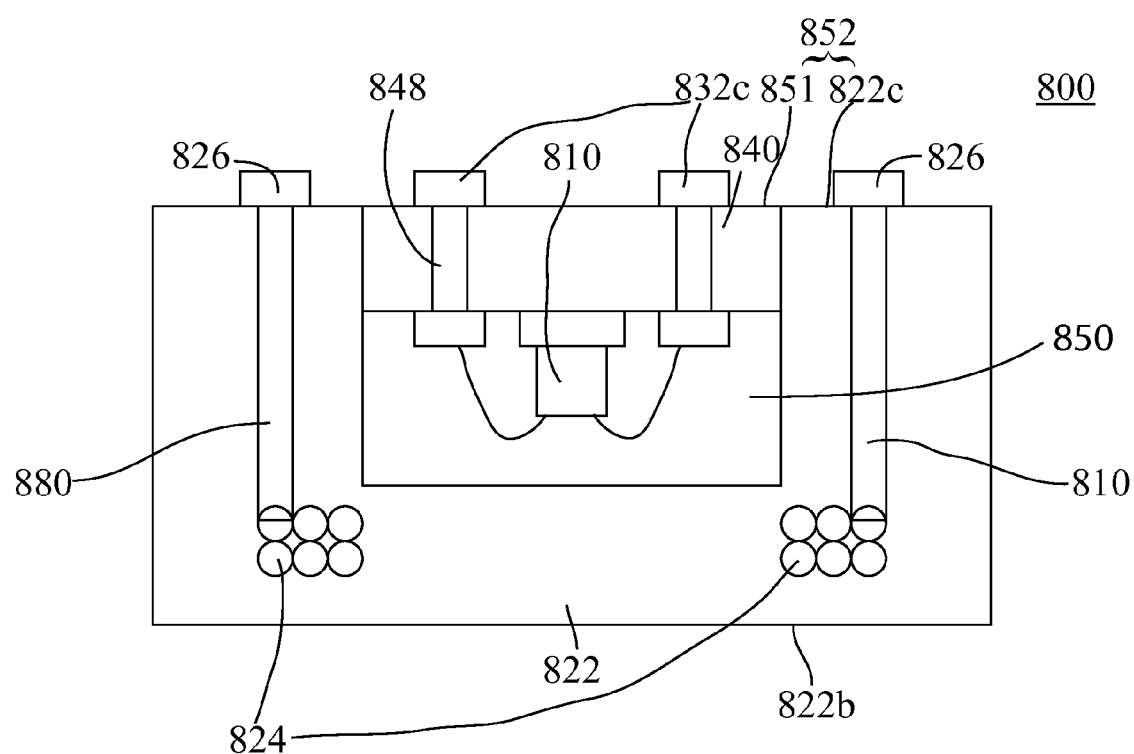

FIG. 6C illustrates a schematic cross-sectional view of example 3. The second conductive element 824 is electrically connected to the second external electrode 826 via the electrical path inside the body 822 and substantially parallel to the lateral surface 822d of the body 822. The electrical path can be formed by vertically forming a via 880 to penetrate the body 822. The via 880 can be formed by known techniques, such as mechanical drilling or laser through-hole, and it can be also applied to a body which is made by LTCC (low-temperature co-fired ceramics) in particular. The first conductive element 810 is electrically connected to the first external electrode 832c via the channel 848 in the circuit substrate 840. In one embodiment, the first conductive element 810 can be reversed in the cavity 822a.

Figure 6D:
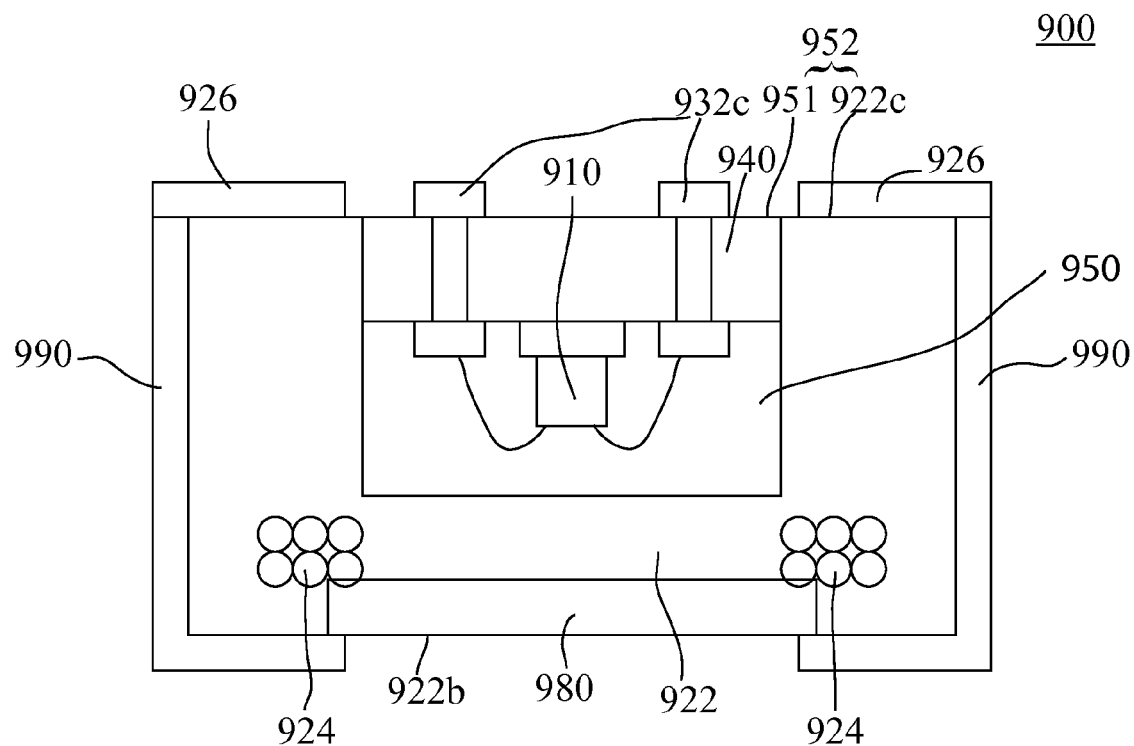

FIG. 6D illustrates a schematic cross-sectional view of example 4. The second conductive element 924 is electrically connected to the second external electrode 926 via the electrical path from the bottom surface 922b, via the lateral surface 922d, to the top surface 922c. Compared with FIG. 6C, the difference between the electronic package structure 800 and the electronic package structure 900 is that the second conductive element 924 is electrically connected to the second external electrode 926 via the electrical path from an interior circuit 980 and a lead 990 from the bottom surface 922b, via the lateral surface 922d, to the first surface 952.

The following describes a method for manufacturing an electronic package structure:
provide a first conductive element, a second conductive element and a body having a top surface with a cavity thereon, wherein the first conductive element is disposed in the cavity and the second conductive element is disposed in the body; form an encapsulation compound in the cavity to encapsulate the first conductive element, wherein the encapsulation compound has a top surface, wherein the top surface of the encapsulation compound and the exposed portions of the top surface of the body which are not covered by the encapsulation compound form a first surface; and dispose a first external electrode and a second external electrode on the first surface, wherein the first conductive element is electrically connected to a first external electrode; and the second conductive element is electrically connected to a second external electrode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A choke, comprising:
a coil, comprising at least one winding turn of a conductive wire;
a magnetic body, wherein the coil is disposed in the magnetic body and the magnetic body comprises a contiguous portion enclosing therein said at least one winding turn of the conductive wire of the coil and extending through a hollow space enclosed by the coil, wherein a cavity is formed on a top surface of the magnetic body and the bottom surface of the cavity is entirely formed by a surface of said contiguous portion of the magnetic body, wherein at least one conductive element is disposed in the cavity, wherein said at least one winding turn of the conductive wire and said at least one conductive element are located at two opposite sides of the bottom surface of the cavity.

2. The choke as claimed in claim 1, wherein a first end of the coil is electrically connected to a first electrode disposed on the top surface of a first protrusion portion surrounding the cavity via a first electrical path disposed inside the magnetic body.

3. The choke as claimed in claim 2, wherein a second end of the coil is electrically connected to a second electrode disposed on the top surface of a second protrusion portion surrounding the cavity via a second electrical path disposed inside the magnetic body.

4. The choke as claimed in claim 1, wherein the at least one conductive element comprises an IC.

5. The choke as claimed in claim 2, wherein the first electrical path inside the magnetic body is substantially parallel to a lateral surface of the magnetic body.

6. The choke as claimed in claim 1, wherein a first end of the coil is electrically connected to a first electrode disposed on the top surface of a first protrusion portion surrounding the cavity via a first electrical path disposed inside the magnetic body; and a second end of the coil is electrically connected to a second electrode disposed on the top surface of a second protrusion portion surrounding the cavity via a second electrical path disposed inside the magnetic body.

7. The choke as claimed in claim 1, wherein the at least one conductive element is disposed on a circuit substrate, wherein the coil is electrically connected to the circuit substrate.

8. The choke as claimed in claim 1, wherein the at least one conductive element is disposed on a lead frame that is disposed in the cavity, wherein the coil is electrically connected to the lead frame.

9. The choke as claimed in claim 1, wherein the at least one conductive element comprises an MOSFET.

10. The choke as claimed in claim 1, wherein the at least one conductive element comprises an IGBT.

11. The choke as claimed in claim 1, wherein the at least one conductive element is included in a module, wherein the module is electrically connected to the coil.

12. The choke as claimed in claim 1, wherein a first end of the coil is electrically connected to a first electrode disposed on a first side surface of the magnetic body.

13. The choke as claimed in claim 12, wherein a second end of the coil is electrically connected to a second electrode disposed on a second side surface of the magnetic body opposite to the first side surface of the magnetic body.

14. The choke as claimed in claim 1, wherein the at least one conductive element is disposed on a lead frame that is disposed in the cavity, wherein a portion of the lead frame is embedded in the magnetic body and electrically connected to the coil.

15. The choke as claimed in claim 1, wherein the at least one conductive element comprises an EMI-shielding element to cover other conductive elements disposed in the cavity.

16. The choke as claimed in claim 1, wherein an EMI-shielding element is disposed on the magnetic body to cover the at least one conductive element disposed in the cavity.

17. The choke as claimed in claim 1, wherein the at least one conductive element is disposed on a circuit substrate, wherein the circuit substrate is disposed on the magnetic body and electrically connected to the coil.

18. The choke as claimed in claim 1, wherein the at least one conductive element is disposed on a circuit substrate, wherein the circuit substrate is disposed in the cavity and electrically connected to the coil.

19. The electronic package structure as claimed in claim 1, wherein the bottom surface of the cavity is a flat surface, wherein a first inner sidewall of the cavity has a flat surface extending from the top surface of the first inner sidewall to the bottom surface of the cavity.

20. The electronic package structure as claimed in claim 19, wherein a second inner sidewall opposite to the first inner sidewall of the cavity has a flat surface extending from the top surface of the second inner sidewall to the bottom surface of the cavity.

* * * * *